United States Patent
Kim et al.

(10) Patent No.: US 8,854,550 B2
(45) Date of Patent: Oct. 7, 2014

(54) DATA PROCESSING DEVICE AND METHOD

(71) Applicant: Samsung Display Co., Ltd., Yongin (KR)

(72) Inventors: Tae-Pyeong Kim, Suwon-si (KR); Han-Kyul Lim, Seoul (KR); Cheon-Oh Lee, Cheonan-si (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 0 days.

(21) Appl. No.: 14/070,841

(22) Filed: Nov. 4, 2013

(65) Prior Publication Data

US 2014/0160356 A1    Jun. 12, 2014

(30) Foreign Application Priority Data

Dec. 10, 2012   (KR) .......................... 10-2012-0142796

(51) Int. Cl.
*H04N 5/14*   (2006.01)
*H04N 9/64*   (2006.01)
*H02H 3/02*   (2006.01)

(52) U.S. Cl.
CPC .. *H02H 3/02* (2013.01); *H04N 5/14* (2013.01)
USPC ........... 348/571; 348/500; 348/510; 348/512; 348/521; 348/533; 348/537; 348/575; 348/468; 348/470; 348/606; 348/607; 348/608; 348/683; 348/701; 348/707; 348/300; 348/295; 348/241; 348/231.5; 348/211.9; 348/138; 341/50; 341/60; 341/110; 341/118; 341/156; 341/155; 341/161; 341/162; 375/219; 375/344; 375/358; 375/359; 375/360; 375/370

(58) Field of Classification Search
USPC ......... 348/512, 500, 521, 537, 575, 571, 510, 348/533, 606, 607, 608, 683, 701, 707, 468, 348/470, 138, 211.9, 231.5, 241, 295, 300; 341/50, 61, 110, 118, 156, 155, 161, 341/462, 60; 375/219, 344, 358, 359, 360, 375/370
See application file for complete search history.

(56) References Cited

U.S. PATENT DOCUMENTS

| | | | | |
|---|---|---|---|---|
| 6,337,651 | B1 * | 1/2002 | Chiang ......................... | 341/161 |
| 6,819,539 | B1 | 11/2004 | Wright et al. | |
| 6,956,519 | B1 * | 10/2005 | Huang et al. .................. | 341/172 |
| 7,286,525 | B1 * | 10/2007 | Laor et al. ..................... | 370/359 |
| 7,719,446 | B2 * | 5/2010 | Rosenthal et al. ............. | 341/61 |
| 7,929,648 | B2 * | 4/2011 | Pourbigharaz et al. ........ | 375/344 |
| 2002/0067787 | A1 * | 6/2002 | Naven et al. .................. | 375/359 |

(Continued)

*Primary Examiner* — Jefferey Harold
*Assistant Examiner* — Mustafizur Rahman
(74) *Attorney, Agent, or Firm* — F. Chau & Associates, LLC

(57) ABSTRACT

A data processing device includes a clock converter, a data converter, and an error detector. The clock converter is configured to receive a first clock signal, convert the first clock signal into a second clock signal, and output the second clock signal. The data converter is configured to receive first data, convert the first data into second data using the second clock signal, and output the second data. The error detector is configured to check whether the first clock signal is in a first clock state or a second clock state upon the first data transitioning to a first data state, and output an enable signal to the clock converter upon determining that the first clock signal has transitioned to the first clock state from the second clock state.

20 Claims, 7 Drawing Sheets

(56) References Cited

U.S. PATENT DOCUMENTS

| | | |
|---|---|---|
| 2004/0082083 A1 | 4/2004 | Kraz et al. |
| 2004/0184054 A1* | 9/2004 | Takahira et al. ............... 358/1.9 |
| 2006/0218361 A1 | 9/2006 | Ehrlich et al. |
| 2009/0128379 A1* | 5/2009 | Rosenthal et al. .............. 341/61 |
| 2009/0195945 A1 | 8/2009 | Mejyr |
| 2009/0213510 A1 | 8/2009 | Klein et al. |
| 2011/0194590 A1* | 8/2011 | Oh et al. ....................... 375/219 |
| 2011/0238345 A1 | 9/2011 | Gauthier et al. |
| 2012/0229497 A1* | 9/2012 | Tripathi et al. ............... 345/596 |

\* cited by examiner

DATA PROCESSING DEVICE AND METHOD

CROSS-REFERENCE TO RELATED APPLICATIONS

This application claims priority under 35 U.S.C. §119 to Korean Patent Application No. 10-2012-0142796 filed on Dec. 10, 2012, the disclosure of which is incorporated by reference herein in its entirety.

TECHNICAL FIELD

Exemplary embodiments of the present invention relate to a data processing device and a method of processing data.

DISCUSSION OF THE RELATED ART

A synchronous system is a communication system in which a receiver and a transmitter operate with the same clock signal, and phases are adjusted or compensated at constant intervals. The synchronous system uses two circuits for respectively receiving data and clock signals, since a transmitter side and a receiver side operate in synchronization with one reference clock.

SUMMARY

Exemplary embodiments of the present invention provide a data processing device having improved reliability, which may return to a normal operation even if an electrostatic discharge (ESD) phenomenon occurs.

Exemplary embodiments of the present invention further provide a method of processing data, which may return to a normal operation even if an ESD phenomenon occurs.

According to an exemplary embodiment of the present invention, a data processing device includes a clock converter, a data converter, and an error detector. The clock converter is configured to receive a first clock signal, convert the first clock signal into a second clock signal, and output the second clock signal. The data converter is configured to receive first data, convert the first data into second data using the second clock signal, and output the second data. The error detector is configured to check whether the first clock signal is in a first clock state or a second clock state upon the first data transitioning to a first data state, and output an enable signal to the clock converter upon determining that the first clock signal has transitioned to the first clock state from the second clock state.

According to an exemplary embodiment of the present invention, a method of processing data includes receiving a first clock signal and first data, checking whether the first clock signal is in a first clock state or a second clock state upon the first data transitioning to a first data state, and outputting an enable signal upon determining that the first clock signal has transitioned to the first clock state from the second clock state.

According to an exemplary embodiment of the present invention, an image processing device includes a video processor and a display device. The display device includes a data processing device and an output unit. The data processing device includes a clock converter, a data converter, and an error detector. The clock converter is configured to receive a first clock signal from the video processor, and convert the first clock signal into a second clock signal. The data converter is configured to receive first image data from the video processor, convert the first image data into second image data using the second clock signal, and output the second image data to the output unit. The error detector is configured to check whether the first clock signal is in a first clock state or a second clock state upon the first data transitioning to a first data state, and output an enable signal to the clock converter upon determining that the first clock signal has transitioned to the first clock state from the second clock state.

BRIEF DESCRIPTION OF THE DRAWINGS

The above and other features of the present invention will become more apparent by describing in detail exemplary embodiments thereof with reference to the accompanying drawings, in which.

DETAILED DESCRIPTION OF THE EXEMPLARY EMBODIMENTS

Figure 1:
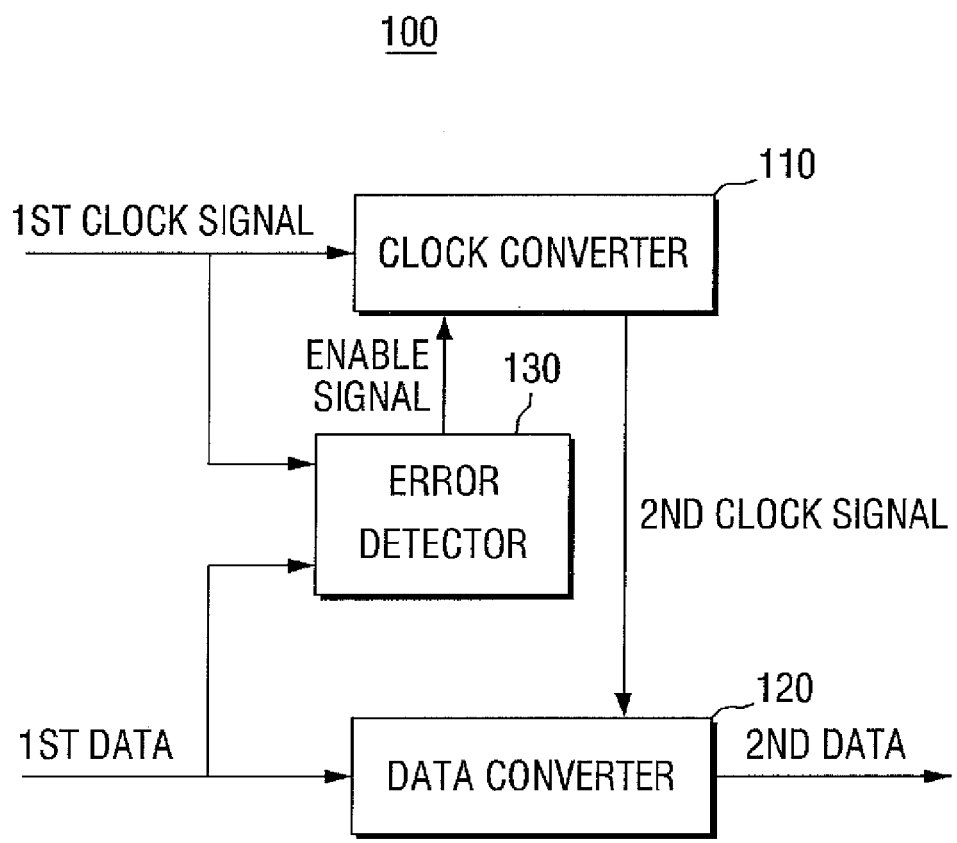
FIG. 1 is a block diagram of a data processing device, according to an exemplary embodiment of the present invention.

Exemplary embodiments of the present invention will be described more fully hereinafter with reference to the accompanying drawings. Like reference numerals may refer to like elements throughout the accompanying drawings.

A data processing device according to an exemplary embodiment of the present invention will be described with reference to FIG. 1.

FIG. 1 is a block diagram of a data processing device, according to an exemplary embodiment of the present invention.

Referring to FIG. 1, the data processing device 100 includes a clock converter 110, a data converter 120 and an error detector 130.

The clock converter 110 may receive a first clock signal, convert the first clock signal into a second clock signal, and then output the second clock signal. The first clock signal may be received from a source external to the data processing device 100, and may be used to convert first data to second data. For example, the second clock signal may be generated by converting the first clock signal. A clock signal is used by the data converter 120 to convert data. The second clock signal may be, for example, a clock signal obtained by eliminating unwanted noise from the first clock signal, and having an amplitude that satisfies requirements of the data converter 120.

The data converter 120 receives the first data from the external source and receives the second clock signal output from the clock converter 110. Referring to the data converter 120, the first data is input data, and the second data is output data. The data converter 120 may convert the first data to the second data using the second clock signal. The first data may be, for example, serialized data supplied with the first clock signal, and the second data may be, for example, deserialized data. Thus, the data converter 120 may function as a series/parallel converter, however, the data converter 120 is not limited thereto. For example, the data converter 120 may also function as an encoder/decoder, a noise eliminating filter, or an amplifier.

The error detector 130 may detect whether an error has occurred at the clock converter 110, and may control the clock converter 110 to operate normally. For example, the error detector 130 may receive the first clock signal and the first data and may check whether the first clock signal has an error when the first data transitions to a first state, as described in further detail below. If it is determined that the first clock signal has an error and the clock converter 110 cannot generate the second clock signal, the error detector 130 generates an enable signal and supplies the enable signal to the clock converter 110. After receiving the enable signal, the clock converter 110 may operate normally again.

A case in which the clock converter 110 cannot generate the second clock signal (e.g., a malfunction of the clock converter 110) may be caused by, for example, an electrostatic discharge (ESD) phenomenon. When an ESD phenomenon occurs, the first clock signal may enter an abnormal state.

When the first clock signal is in an abnormal state and the clock converter 110 malfunctions, the clock converter 110 cannot generate the second clock signal. As a result, the data converter 120 cannot output the second data. Preventing the first clock signal from entering an abnormal state may result in avoiding this case. Although an ESD protection circuit may be used, the ESD phenomenon may still occur, which may cause the first clock signal to enter an abnormal state and the clock converter 110 to malfunction. According to exemplary embodiments of the present invention, the error detector 130 may be included in the data processing device 100, and even if the clock converter 110 malfunctions due to the ESD phenomenon, the error detector 130 may allow the clock converter 110 to return to normal operation.

Operations of a data processing device according to an exemplary embodiment of the present invention will be described herein with reference to FIGS. 1 to 3.

Figure 2:
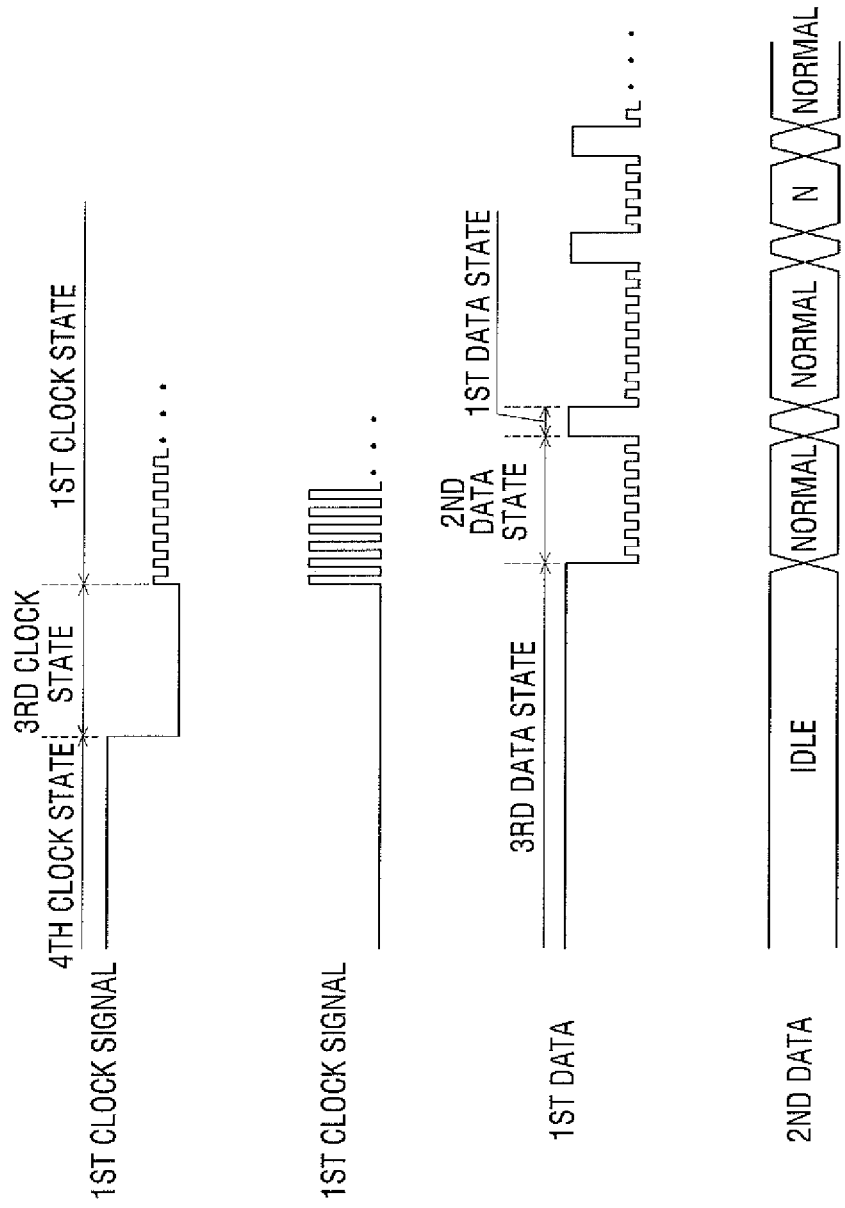
FIGS. 2 and 3 are timing diagrams illustrating operations of a data processing device, according to an exemplary embodiment of the present invention.
Figure 3:
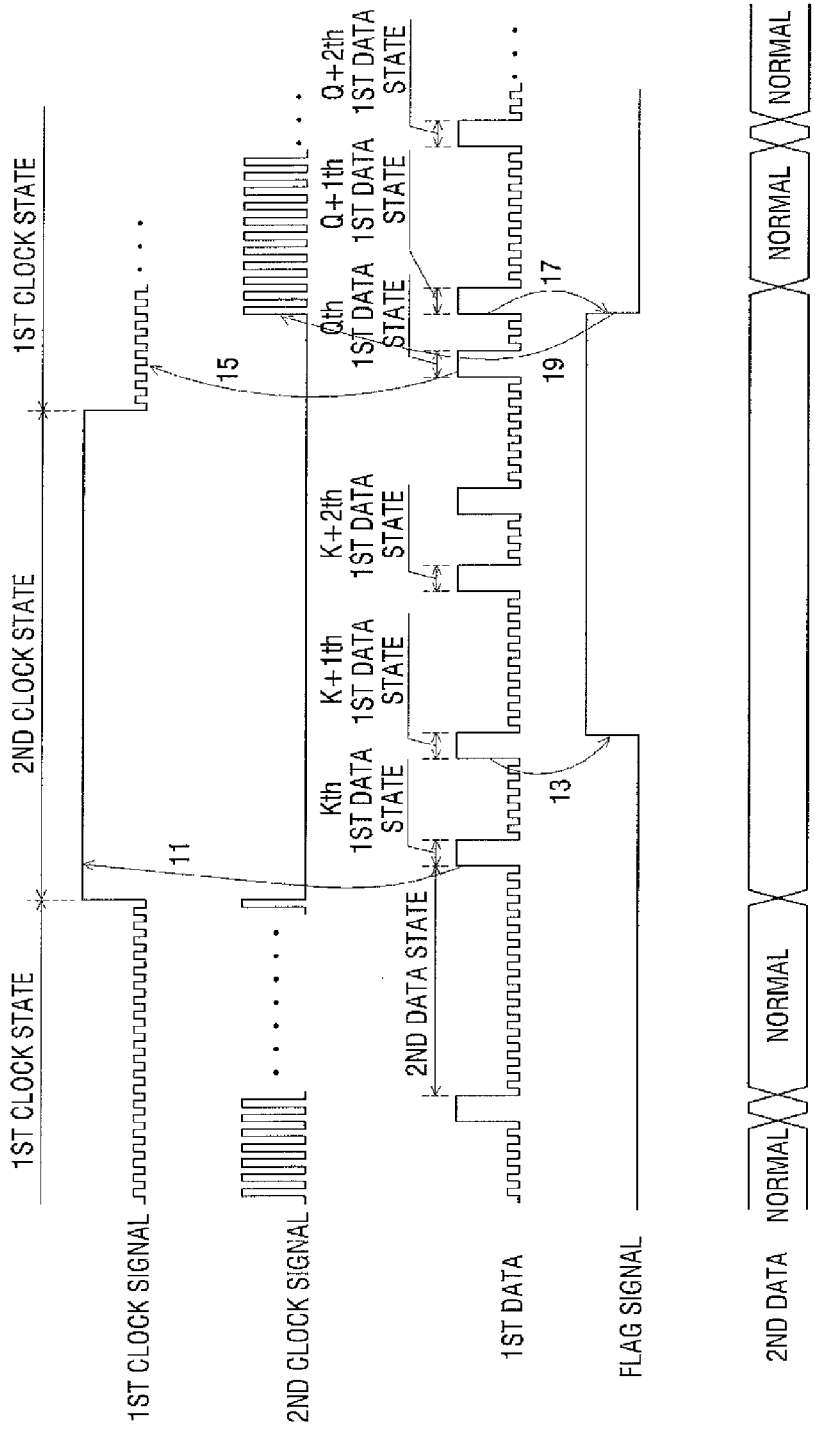

FIGS. 2 and 3 are timing diagrams illustrating operations of a data processing device, according to an exemplary embodiment of the present invention.

Referring to FIGS. 1 to 3, the first clock signal supplied to the clock converter 110 may have first to fourth clock states. The first clock state may be a state in which the first clock signal is normally supplied. The second clock state may be a state in which the first clock signal is abnormally supplied. For example, the second clock state may refer to a state in which the first clock signal is not supplied due to the occurrence of ESD, however, causes of the second clock state are not limited thereto. For example, the second clock state may also refer to a state in which the first clock signal is not supplied due to factors other than the occurrence of ESD.

The third clock state may refer to a state in which the clock converter 110 determines that the first clock signal has transitioned to a second state. For example, the third clock state may correspond to a signal instructing the clock converter 110 to convert the first clock signal. The third clock state may be generated immediately before the second clock state starts. If the first clock signal is in the third clock state, the clock converter 110 prepares for operating, and when the first clock signal transitions to the second clock state, the clock converter 110 converts the first clock signal to the second clock signal. If the clock converter 110 is not supplied with the first clock signal in the third clock state, the clock converter 110 does not generate the second clock signal, even with the first clock signal in the second state supplied thereto.

The fourth clock state may refer to an idle state. For example, the fourth clock state may refer to a state in which power supplied to the clock converter 110 is interrupted and the clock converter 110 does not operate.

For example, the clock converter 110 of the data processing device 100 may not operate when the first clock signal is in the fourth clock state, may prepare for operation when the first clock signal is in the third clock state, and may convert the first clock signal into the second clock signal when the first clock signal transitions to the second clock state from the third clock state.

The data converter 120 may receive the second clock signal and the first data. The first data may have first to third data states. The second data state may refer to a state in which the first data is normally supplied. If the data converter 120 receives the second clock signal in the first data state, the data converter 120 converts the first data into the second data and outputs the second data. In an exemplary embodiment, the data converter 120 may only convert the first data into the second data when the first data is in the first data state and the second clock signal is supplied. For example, when the first data is not in the first data state or the second clock signal is not supplied to the data converter 120, the data converter 120 does not generate the second data.

The first data state may refer to a state in which the first data is normally supplied. The first data may not be continuously supplied in the second data state. The first data may be, for example, serialized data, which may be converted for supplying original data to the data processing device 100. The respective sizes of original data to be transmitted may be different from each other. For example, the original data may have data sizes of 3 bits, 8 bits and 4 bits in turn. Each of the original data may be serialized to become the first data. Since the first data may be serialized in synchronization with cycles of the first clock signal, if the original data has different data sizes, the first data may not always be in the second data state, but may instead be in the first data state in which data is not intermittently supplied. The first data may not regularly transition to the first data state, but instead, may randomly transition to the first data state. For example, the number of first data states generated and the frequency of first data states generated may not be constant.

The third data state may refer to an idle state. For example, the third data state may refer to a state in which first data is not supplied and the data converter 120 does not operate.

For example, the data converter 120 may not operate when the first data is in the third data state and does not generate the second data, and may convert the first data into the second data and output the same (N, NORMAL) when the second clock signal is supplied and the first data is in the second data state.

Even if the second clock signal is supplied, the data converter 120 may not generate the second data when the first data is in the first data state, and may generate the second data when the first data returns to the second data state. If the second clock signal is not supplied, the data converter 120 may not convert the first data into the second data.

The error detector 130 starts operating when the first data is in the second data state. Since the data processing device 100 is in an idle state when the first data is in the third data state or when the first clock signal is in the third clock state or the fourth clock state, it is not necessary to determine whether the data processing device 100 is abnormally operating.

The error detector 130 checks the state of the first clock signal whenever the first data transitions to the first data state. Thus, it is checked whether the first clock signal is in the first clock state or in the second clock state. If the first clock signal returns to the first clock state from the second clock state, the error detector 130 may generate and output the enable signal. The enable signal instructs the clock converter 110 to perform an operation that includes converting the first clock signal to the second clock signal. When the first clock signal transitions to the first clock state from the second clock state, the clock converter 110 may not be able to generate the second clock signal because the first clock signal is not in the third clock state before the first clock state is initialized. In this case, if the error detector 130 supplies the enable signal to the clock converter 110, the clock converter 110 may generate the second clock signal even when the first clock signal does not transition to the third clock state. Therefore, even if the first clock signal returns immediately to the first clock state from the second clock state without passing through the third clock state after the first clock signal is in the second clock state, the clock converter 110 supplied with the enable signal may convert the first clock signal to the second clock signal again.

The error detector 130 checks the state of the first clock signal whenever the first data transitions to the first data state. If the state of the first clock signal is checked whenever the first data transitions to the first data state, the data processing device 100 may not require an additional clock signal for operating the error detector 130. Therefore, the circuit configuration of the data processing device 100 according to exemplary embodiments of the present invention can be simplified.

The operation of the error detector 130 is herein described in further detail with reference to FIGS. 1 and 3.

If the first clock signal is in the first clock state, the clock converter 110 may convert the first clock signal into the second clock signal and output the second clock signal, and the data converter 120 may convert the first data into the second data using the second clock signal and output the second data. The error detector 130 may check whether the first clock signal is in the first clock state or in the second clock state whenever the first data transitions to the first state.

If the first clock signal transitions to the second clock state from the first clock state, the first clock signal may not be converted into the second clock signal, and the second clock signal may not be generated.

As indicated by reference numeral 11, when the first data is in a Kth first data state (K is a natural number), the error detector 130 may check whether the first clock signal is in the second clock state.

As indicated by reference numeral 13, if it is confirmed that the first clock signal is in the second clock state, the error detector 130 may generate a flag signal when the first data is in a (K+1)th first data state. Since the error detector 130 may not be able to immediately generate the flag signal in the Kth first data state, the error detector 130 may generate the flag signal in the (K+1)th first data state, however, exemplary embodiments are not limited thereto. For example, the error detector 130 may generate the flag signal in a (K+2)th first data state or in a (K+3)th first data state. Unless the first clock signal transitions to the first clock state after generating the flag signal, the flag signal may be maintained.

Next, the first clock signal returns to the first clock state from the second clock state. However, since the first clock signal may not have returned to the first clock state after passing through the third clock state, the clock converter 110 may not convert the first clock signal into the second clock signal, and the data converter 200 not supplied with the second clock signal may not be able to convert the first data into the second data.

As indicated by reference numeral 15, the error detector 130 checks whether the first clock signal returns to the first clock state from the second clock state when the first data transitions to a Qth first data state (Q is a natural number greater than K).

As indicated by reference numeral 17, the error detector 130 may eliminate the flag signal in the (Q+1)th first data state. Since the flag signal may not be immediately eliminated in the Qth first data state, the error detector 130 may eliminate the flag signal in the (Q+1)th first data state, however, exemplary embodiments are not limited thereto. For example, the error detector 130 may eliminate the flag signal in a (Q+2)th first data state, a (Q+3)th first data state, etc. Unless the first clock signal transitions to the second clock state from the first clock state again, the error detector 130 may not generate the flag signal.

As indicated by reference numeral 19, the error detector 130 may generate the enable signal when the flag signal is eliminated. The generated enable signal is output to then be supplied to the clock converter 110, and the clock converter 110 performs the operation of converting the first clock signal into the second clock signal. Since the data converter 120 receives the second clock signal from the clock converter 110, the data converter 120 may convert the first data into the second data. Consequently, even if an ESD phenomenon occurs, that is, even if the first clock signal transitions to the second clock state, the data processing device 110 may be returned to normal operation by the error detector 130.

Figure 4:
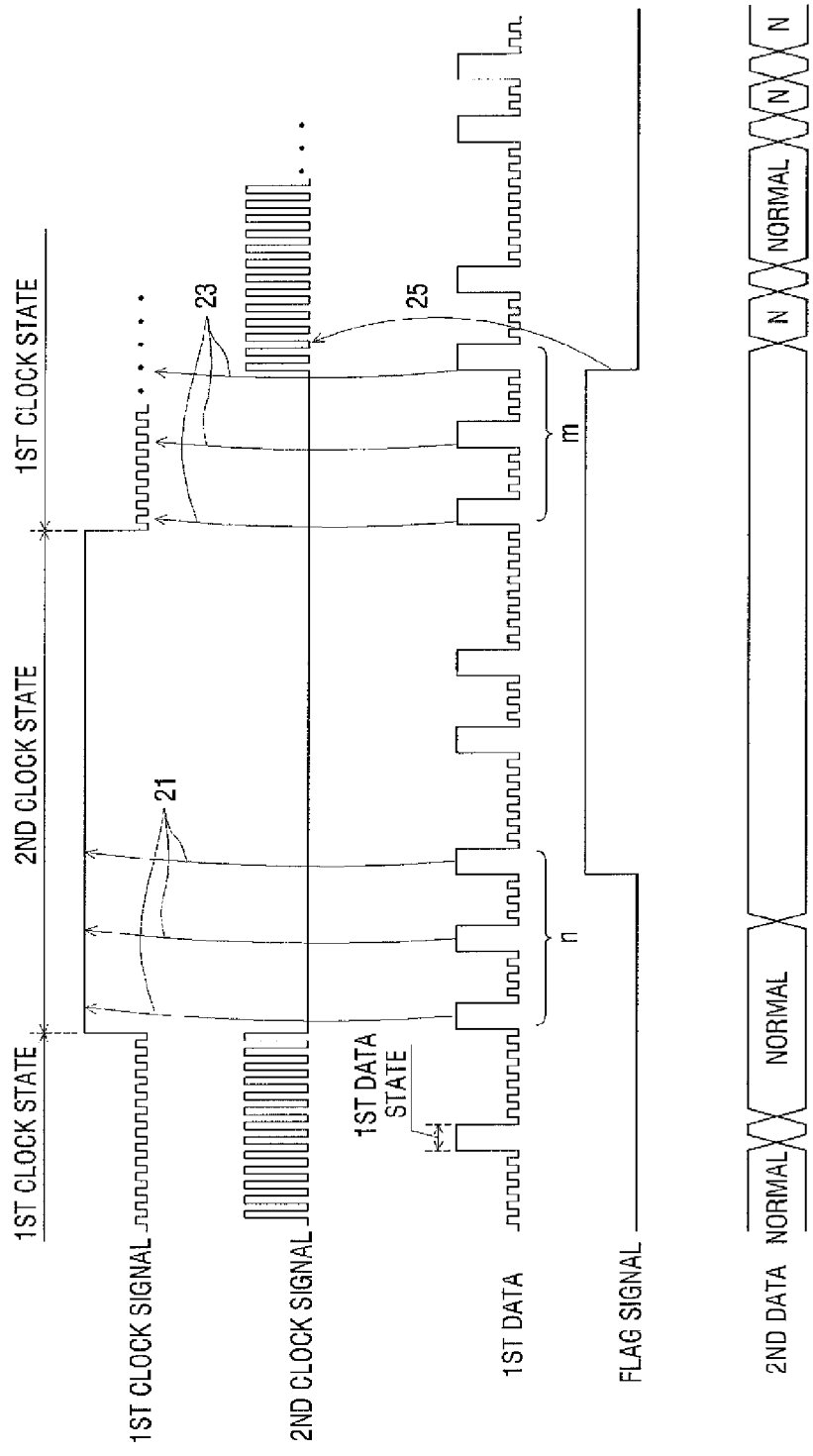
FIG. 4 is a timing diagram illustrating operations of a data processing device, according to an exemplary embodiment of the present invention.

A data processing device according to an exemplary embodiment of the present invention is described herein with reference to FIGS. 1 and 4. For convenience of explanation, a description of elements and processes previously described may be omitted, and the following description may focus on differences between the data processing device 100 described herein and the data processing device 100 previously described.

FIG. 4 is a timing diagram illustrating operations of a data processing device 100, according to an exemplary embodiment of the present invention.

Differences between the data processing device 100 described herein and the data processing device 100 previously described include differences relating to generating and eliminating a flag signal.

Referring to FIGS. 1 to 4, in the data processing device 100 as previously described, the error detector 130 may check whether the first clock signal is in the second clock state only once, and then generates the flag signal. In addition, referring to eliminating the flag signal, the error detector 130 may check whether the first clock signal is in the first clock state only once, and then eliminates the flag signal. However, in the data processing device 100 as described herein, the error detector 130 may check whether the first clock signal is in the second clock state multiple times, and then may generate the flag signal. In addition, referring to eliminating the flag signal, the error detector 130 may check whether the first clock signal is in the first clock state multiple times.

For example, as indicated by reference numeral 21, the error detector 130 checks n times (n is a natural number) whether the first clock signal is in the second clock state, and generates the flag signal if it is confirmed that the first clock signal is in the second clock state continuously for n times. In addition, the error detector 130 checks whether the first clock signal returns to the first clock state from the second clock state, and eliminates the flag signal if it is confirmed that the first clock signal is in the first clock state continuously for m times (m is a natural number).

In a case where states of the first clock signal are continuously changed between the first clock state and the second clock state with a short cycle, if the error detector 130 checks whether the first clock signal is in the second clock state or in the first clock state only once, and then generates or eliminates the flag signal, the enable signal is generated multiple times and then output. In this case, it is possible for the clock converter 110 to be excessively supplied with the enable signal, and the clock converter 110 may become overloaded. If the error detector 130 checks the state of the first clock signal multiple times and then generates or eliminates the flag signal, the number of the enable signals output may be reduced.

Hereinafter, a method for processing data according to an exemplary embodiment of the present invention will be described with reference to FIGS. 1, 5 and 6. For convenience of explanation, a description of elements and processes previously described may be omitted.

Figure 5:
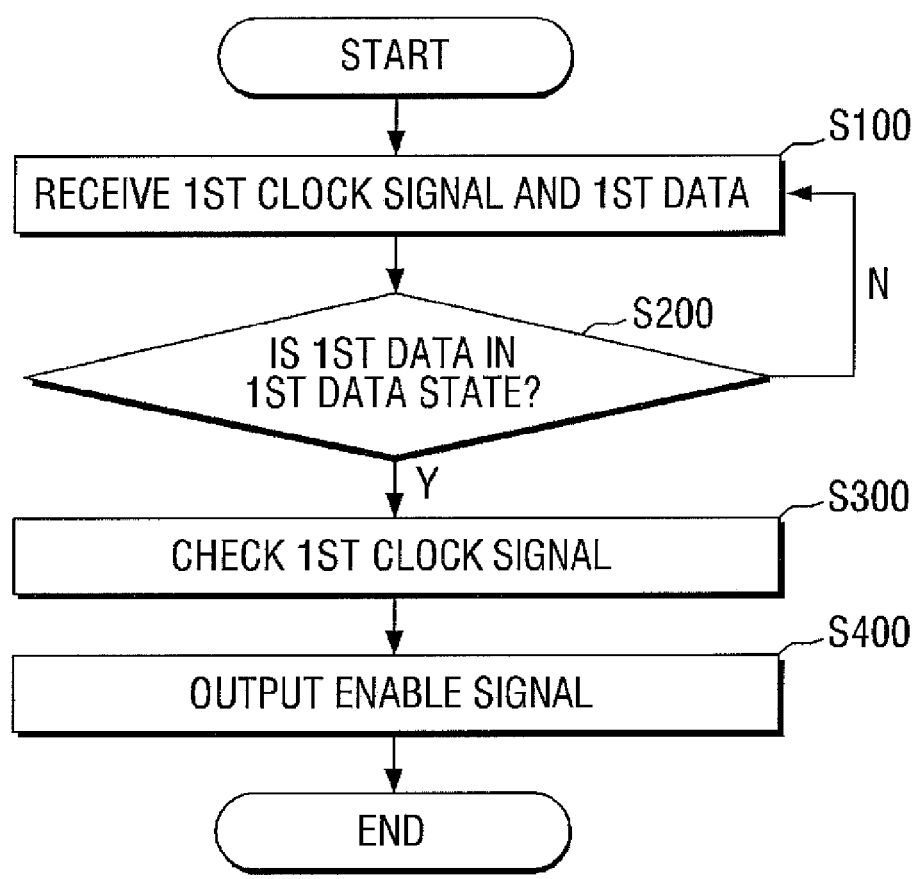
FIGS. 5 and 6 are flowcharts illustrating a method of processing data, according to an exemplary embodiment of the present invention.
Figure 6:
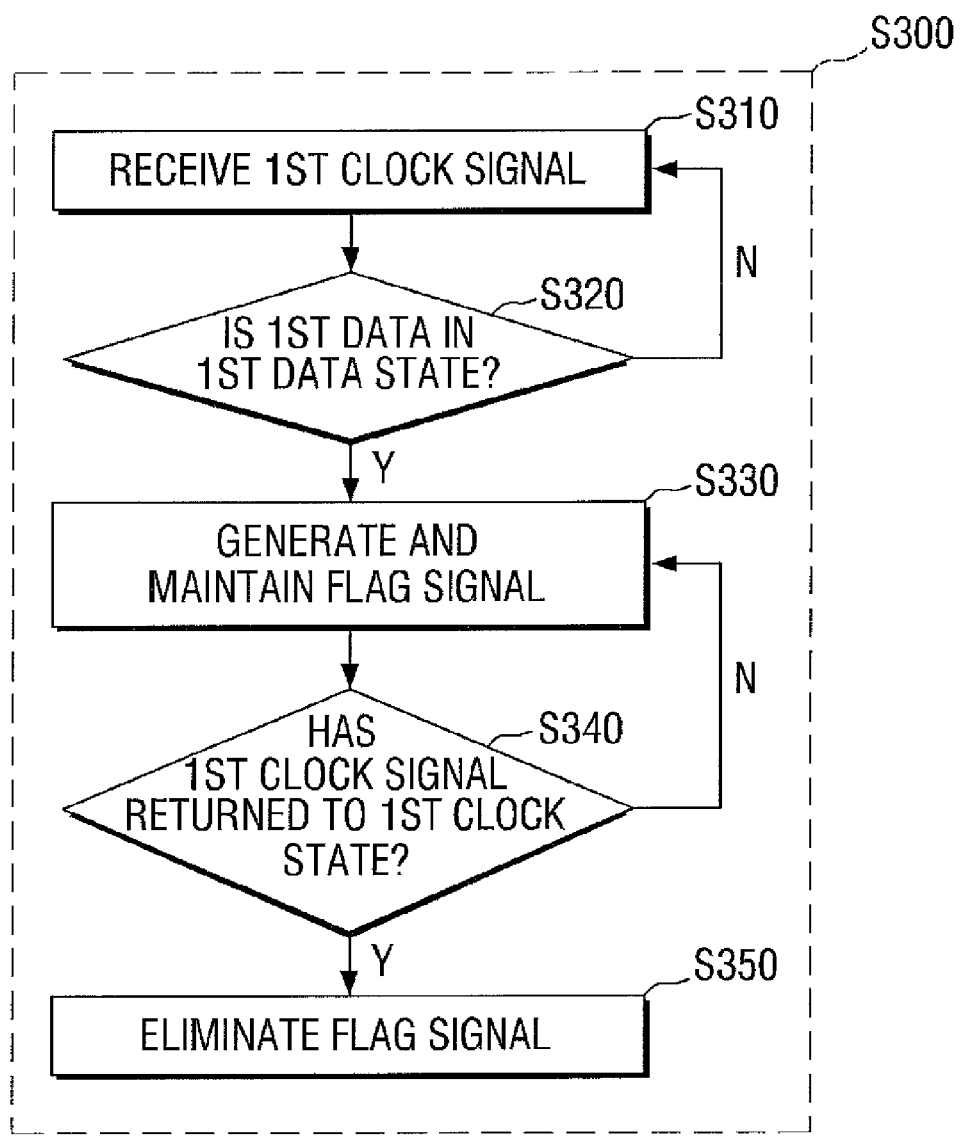

FIGS. 5 and 6 are flowcharts illustrating a method of processing data, according to an exemplary embodiment of the present invention.

At block S100, a first clock signal and first data are received. The first clock signal is supplied to the clock converter 110 to then be converted into a second clock signal and supplied to the error detector 130. The state of the first clock signal is checked by the error detector 130. The first data is supplied to the data converter 120 and the error detector 130.

At block S200, whenever the first data transitions to the first data state, it is checked whether the first clock signal is in the first clock state or in a second clock state at block S300. The error detector 130 determines whether the first data is in the first data state. The error detector 130 may not check the state of the first clock signal if the first data is not in the first data state, but may instead check the state of the first clock signal if the first data is in the first data state. Whenever the first data transitions to the first data state, the state of the first clock signal may be checked.

A method of checking the first clock signal as performed at block S300 will be described in further detail herein with reference to FIG. 6.

At block S310, the error detector 130 receives the first clock signal.

At block S320, the error detector 130 checks whether the first clock signal is in the first clock state or in the second clock state.

If the first clock signal is in the second clock state, the error detector 130 generates and maintains a flag signal at block S330. If the first clock signal is in the second clock state when the first data is in a kth first data state, the error detector 130 may generate the flag signal when the first data is in a (k+1)th first data state. Even after the flag signal is generated, the error detector 130 may check the first clock signal whenever the first data transitions to the first data state.

At block S340, the error detector 130 checks the first clock signal to determine whether the first clock signal has returned to the first clock state from the second clock state.

If the first clock signal is continuously in the second clock state, the flag signal is maintained. However, if the first clock signal returns to the first clock state from the second clock state, the error detector 130 may eliminate the flag signal at block S350. After generating the flag signal, if the first clock signal is in the first clock state when the first data is in a qth first data state, the error detector 130 may eliminate the flag signal when the first data is in a (q+1)th first data state.

Referring again to FIG. 5, if the flag signal is eliminated, that is, if the first clock signal returns to the first clock state from the second clock state, the error detector 130 outputs an enable signal and supplies the enable signal to the clock converter 110 at block S400. If the clock converter 110 receives the enable signal, the clock converter 110 performs an operation of converting the first clock signal into the second clock signal and outputs the second clock signal, and the data converter 120 receives the second clock signal and converts the first data into the second data using the second clock signal.

Hereinafter, image processing devices including the data processing device 100 according to exemplary embodiments of the present invention will be described with reference to FIG. 7.

Figure 7:
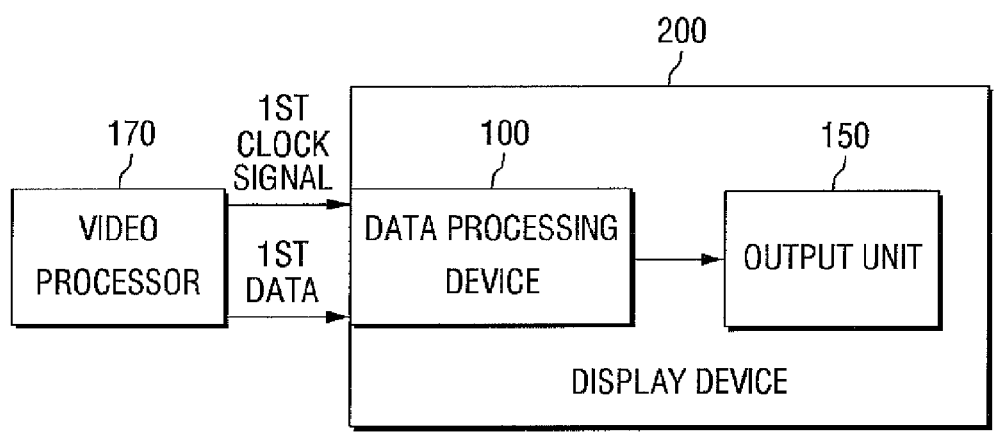
FIG. 7 is a block diagram illustrating image processing devices including data processing devices, according to exemplary embodiments of the present invention.

FIG. 7 is a block diagram illustrating image processing devices including data processing devices, according to exemplary embodiments of the present invention.

Referring to FIG. 7, the data processing device 100 may be included in, for example, a display device 200. The data processing device 100 may be connected to an output unit 150 of the display device 200 to supply second data to the output unit 150.

The first data and the second data may be, for example, image data. In order to output an image to the output unit 150, the data processing device 100 and the output unit 150 need to receive the image data. The image data (e.g., the second data) output to the output unit 150 is supplied on a frame-by-frame basis. Since the image data is supplied on a frame-by-frame basis, the image data is not continuously supplied to the display device 200. Therefore, if the first data is image data, the first data may have both a first data state and a second data state. The second data may also be non-continuous data streams.

The display device 200 may be included in, for example, an image processing device 300. The image processing device 300 may include, for example, a video processor 170 and the display device 200. The video processor 170 processes the image data to be output to the display device 200, and may convert original data into first data to supply the data to the display device 200. The video processor 170 supplies the first data and the first clock signal required for converting the first data to the display device 200. The display device 200 converts the first data into the second data through the data processing device 100.

The display device 200 may be, for example, a touch screen, however, the display device 200 is not limited thereto. For example, the display device 200 may include any type of device capable of outputting an image. The image processing device 300 may include, for example, a smart phone, a tablet PC, a notebook computer, a TV, etc., however, the image processing device 300 is not limited thereto.

While the present invention has been particularly shown and described with reference to exemplary embodiments thereof, it will be understood by those of ordinary skill in the art that various changes in form and detail may be made therein without departing from the spirit and scope of the present invention as defined by the following claims.

What is claimed is:

1. A data processing device, comprising:
   a clock converter configured to receive a first clock signal, convert the first clock signal into a second clock signal, and output the second clock signal;
   a data converter configured to receive first data, convert the first data into second data using the second clock signal, and output the second data; and
   an error detector configured to check whether the first clock signal is in a first clock state or a second clock state upon the first data transitioning to a first data state, and output an enable signal to the clock converter upon determining that the first clock signal has transitioned to the first clock state from the second clock state.

2. The data processing device of claim 1, wherein the second clock state corresponds to an occurrence of an electrostatic discharge (ESD).

3. The data processing device of claim 1, wherein the clock converter is configured to receive the first clock signal in a third clock state, convert the first clock signal into the second clock signal, and output the second clock signal.

4. The data processing device of claim 1, wherein the error detector is configured to generate a flag signal and hold the flag signal while the first clock signal is in the second clock state, and eliminate the flag signal and output the enable signal to the clock converter upon the first clock signal transitioning to the first clock state from the second clock state.

5. The data processing device of claim 4, wherein the error detector is configured to generate the flag signal when checking the first clock signal indicates that the first clock signal has been in the second clock state n continuous times, wherein n is a natural number.

6. The data processing device of claim 5, wherein the error detector is configured to eliminate the flag signal after generating the flag signal when checking the first clock signal indicates that the first clock signal has been in the first clock state m continuous times, wherein m is a natural number.

7. The data processing device of claim 4, wherein the error detector is configured to generate the flag signal when the first data is in a (k+1)th data state while the first clock signal is in the second clock state and the first data is in a kth first clock state, wherein k is a natural number.

8. The data processing device of claim 7, wherein the error detector is configured to eliminate the flag signal after generating the flag signal when checking the first clock signal indicates that the first clock signal is in the first clock state and the first data is in a (q+1)th first data state, wherein q is a natural number greater than k.

9. The data processing device of claim 8, wherein the error detector is configured to transmit the enable signal to the clock converter upon the error detector eliminating the flag signal.

10. The data processing device of claim 1, wherein the first data comprises serialized data, and the second data comprises deserialized data.

11. The data processing device of claim 10, wherein the first and second data comprise image data.

12. A method of processing data, comprising:
receiving a first clock signal and first data;
checking whether the first clock signal is in a first clock state or a second clock state upon the first data transitioning to a first data state; and
outputting an enable signal upon determining that the first clock signal has transitioned to the first clock state from the second clock state.

13. The method of claim 12, wherein the enable signal initializes an operation comprising converting the first clock signal to the second clock signal.

14. The method of claim 12, wherein
checking whether the first clock signal is in the first clock state or the second clock state comprises generating and holding a flag signal while the first clock signal is in the second clock state, and eliminating the flag signal upon the first clock signal transitioning to the first clock state from the second clock state, and
outputting the enable signal comprises outputting the enable signal upon eliminating the flag signal.

15. The method of claim 14, wherein
generating the flag signal comprises generating the flag signal when the first data is in a (k+1)th first data state while the first clock signal is in the second clock state and the first data is in a kth first data state, and
eliminating the flag signal comprises eliminating the flag signal when the first data is in a (q+1)th first data state while the first clock signal is in the first clock state and the first data is in a qth first data state,
wherein k is a natural number, and q is a natural number greater than k.

16. An image processing device, comprising:
a video processor; and
a display device comprising a data processing device and an output unit, wherein the data processing device comprises:
a clock converter configured to receive a first clock signal from the video processor, and convert the first clock signal into a second clock signal;
a data converter configured to receive first image data from the video processor, convert the first image data into second image data using the second clock signal, and output the second image data to the output unit; and
an error detector configured to check whether the first clock signal is in a first clock state or a second clock state upon the first data transitioning to a first data state, and output an enable signal to the clock converter upon determining that the first clock signal has transitioned to the first clock state from the second clock state.

17. The image processing device of claim 16, wherein the second image data is supplied to the output unit on a frame-by-frame basis.

18. The image processing device of claim 16, wherein the display device is a touch screen.

19. The image processing device of claim 16, wherein the image processing device is a smart phone, a tablet computer, or a television.

20. The image processing device of claim 16, wherein the second clock state corresponds to an occurrence of an electrostatic discharge (ESD).

* * * * *